United States Patent
Ku et al.

(10) Patent No.: US 12,334,363 B2
(45) Date of Patent: Jun. 17, 2025

(54) PURGE CONTROLLING SYSTEM

(71) Applicant: Brillian Network & Automation Integrated System Co., Ltd., Miaoli County (TW)

(72) Inventors: Chen-Wei Ku, Miaoli County (TW); Han-Cheng Hu, Miaoli County (TW); Min-Che Li, Miaoli County (TW)

(73) Assignee: BRILLIAN NETWORK & AUTOMATION INTEGRATED SYSTEM CO., LTD., Miaoli County (TW)

( * ) Notice: Subject to any disclaimer, the term of this patent is extended or adjusted under 35 U.S.C. 154(b) by 379 days.

(21) Appl. No.: 17/885,346

(22) Filed: Aug. 10, 2022

(65) Prior Publication Data

US 2023/0054047 A1 Feb. 23, 2023

(30) Foreign Application Priority Data

Aug. 23, 2021 (TW) .................................. 110131008
Mar. 25, 2022 (TW) .................................. 111111308

(51) Int. Cl.
*H01L 21/67* (2006.01)
*F24F 9/00* (2006.01)
*H01L 21/677* (2006.01)
*C23C 16/44* (2006.01)

(52) U.S. Cl.
CPC .......... *H01L 21/67017* (2013.01); *F24F 9/00* (2013.01); *H01L 21/67126* (2013.01); *H01L 21/67772* (2013.01); *C23C 16/4408* (2013.01); *F24F 2009/005* (2013.01); *H01L 21/67775* (2013.01)

(58) Field of Classification Search
CPC .............................. F24F 9/00; F24F 2009/005
See application file for complete search history.

(56) References Cited

U.S. PATENT DOCUMENTS

| | | | |
|---|---|---|---|
| 3,301,162 A * | 1/1967 | Zumbiel | F24F 9/00 454/192 |
| 2020/0118810 A1* | 4/2020 | Hu | H01L 21/67389 |
| 2020/0234988 A1* | 7/2020 | Lin | H01L 21/67769 |

FOREIGN PATENT DOCUMENTS

KR 20120027010 A * 3/2012

OTHER PUBLICATIONS

Okutstu, KR20120027010 and translation (Year: 2012).*

* cited by examiner

*Primary Examiner* — Steven S Anderson, II
(74) *Attorney, Agent, or Firm* — Muncy, Geissler, Olds & Lowe, P.C.

(57) ABSTRACT

A purge controlling system includes a purge module and a control module. The purge module is arranged in the load port and is electrically connected with the control module. The purge module includes an air curtain unit, a flow control unit and a sensing unit. The control module controls the purge module to provide adequate gas flow of purge gas into the air curtain unit and form a gas curtain according to the displacement value of the door assembly.

7 Claims, 4 Drawing Sheets

PURGE CONTROLLING SYSTEM

CROSS-REFERENCE TO RELATED APPLICATIONS

This application claims the benefit of TW Patent Application No. 110131008, filed Aug. 23, 2021, and TW Patent Application No. 111111308, filed Mar. 25, 2022, which is incorporated in its entirety by reference herein.

FIELD OF THE INVENTION

The present invention relates to the technical field of semiconductors, particularly relates to a purge controlling system which is provided for controlling the gas flow of the purge gas to create a gas curtain in the form of laminar flow or uniform flow.

BACKGROUND OF THE INVENTION

In the present semiconductor production plant, there are various equipment for transferring the wafer cassettes, and most of equipment is produced by different manufactures. Therefore, when the door of the wafer cassette is opened, the inside of the wafer cassette directly communicates with the environment, and the contamination, or particles outside of the wafer cassette may easily enter the wafer cassette to pollute the wafer or semiconductor component(s) therein.

SUMMARY OF THE INVENTION

According to the disadvantages of the prior art, it is an object of the present invention to utilize a control module that controls an air curtain unit to provide and regulate the flow velocity of the gas curtain according to the displacement value of a door assembly of the load port to prevent the purge gas with large gas flow from inducing the turbulent flow to carry the contamination into a wafer cassette and pollute the semiconductor component(s) or wafer in the wafer cassette.

It is another object of the present invention to control the gas flow and pressure of the purge gas that enters the air curtain unit to create laminar flow of a gas curtain to solve the technical problem of the turbulent flow of the purge gas which may carry the contaminant or particle into the wafer cassette to pollute the semiconductor component(s) or wafer therein.

It is still an object of the present invention to utilize a sensing unit on the load port to detect the displacement value of a door assembly. The displacement value of the door assembly can regulate the flow velocity of the gas curtain to solve the problem of the gas curtain with same large flow velocity regardless of the displacement value of the door assembly of the load port after opening the door, which cause the waste of the purge gas and increase the cost of the use.

It is an object of the present invention to provide a ventilation plate which includes a plurality of vents, the material of the ventilation plate can be stainless steel, ultra-high molecular weight polyethylene to increase the pressure resistance of the ventilation plate and improve the flow velocity of the gas curtain.

According to the above objects, the present invention provides a purge controlling system connected with the load port, and the purge controlling system includes a purge module and a control module, in which the purge module is arranged in the load port and the control module is electrically connected with the purge module. The purge module includes an air curtain unit, a flow control unit, and a sensing unit. The air curtain unit is arranged above the door assembly of the load port. The flow control unit is connected to the air curtain unit. The control module is electrically connected with the purge module. The control module controls the air curtain unit to create corresponding flow velocity of a gas curtain according to a displacement value of the door assembly.

In one preferred embodiment of the present invention, the purge module includes a sensing unit arranged on the load port, and the sensing unit is provided for detecting the displacement status of the door assembly of the load port to provide the control module to judge the gas flow of the purge gas.

In one preferred embodiment of the present invention, the air curtain unit includes a main body and a ventilation plate, in which an upper end and/or one side of the main body includes at least a gas inlet which is communicated with the purge module through the pipeline, so the purge gas of the air curtain unit enter into the main body through the pipeline and the gas inlet; and at least one ventilation plate is arranged in the main body, the ventilation plate includes a plurality of vents which are provided for discharging the purge gas out of the main body, so a gas curtain is formed between the air curtain unit and the door assembly of the load port.

In one preferred embodiment of the present invention, the material of the ventilation plate can be stainless steel, antistatic and corrosion-resistant fiber or composite, ceramic, resin, or ultra-high molecular weight polyethylene.

In a preferred embodiment of the present invention, when the ventilation plate is stainless steel, the ventilation plate with a plurality of vents may be formed by metal sintering.

In one preferred embodiment of the present invention, the plurality of vents of the ventilation may be formed by mechanical drilling or laser drilling.

In one preferred embodiment of the present invention, each the ventilation plate includes a plurality of vents, and the plurality of ventilation plates form at least one closed space in the main body.

In one preferred embodiment of the present invention, the flow velocity of the gas curtain created by the air curtain unit ranges from 0.1 m/s-2 m/s.

In one preferred embodiment of the present invention, the gas supply device connected to the purge controlling system, and the gas supply device is used to provide the purge gas, and the purge gas may be CDA (clean dry air), X-CDA (extreme clean dry air) or inert gas.

In one preferred embodiment of the present invention, the gas flow of the purge gas supplied by the gas supply device to the purge controlling system ranges from 0-800 LPM (liter per minute).

DETAILED DESCRIPTION OF THE PREFERRED EMBODIMENT

Figure 1:
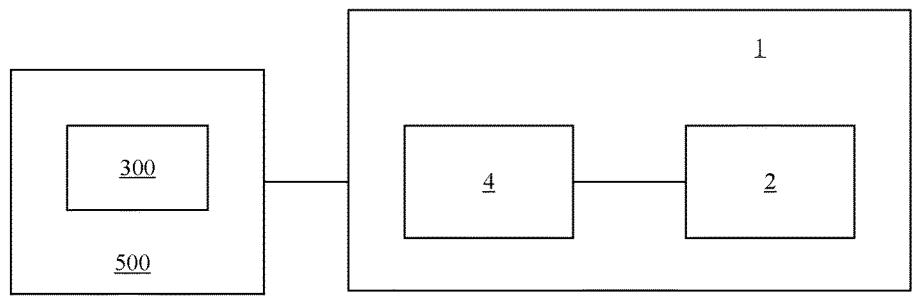
FIG. 1 is a block diagram of showing a purge controlling system in accordance with the present invention.

First, please refer to FIG. 1. FIG. 1 is a block diagram of showing a purge controlling system according to the present invention. In FIG. 1, a purge controlling system 1 connects with the load port 500, and the purge controlling system is at least composed of a control module 2 and a purge module 4. The control module 2 controls the purge module 4 to inflate a wafer cassette 300 placed on the load port 500 to achieve the purpose of inflation/purge.

Figure 2:
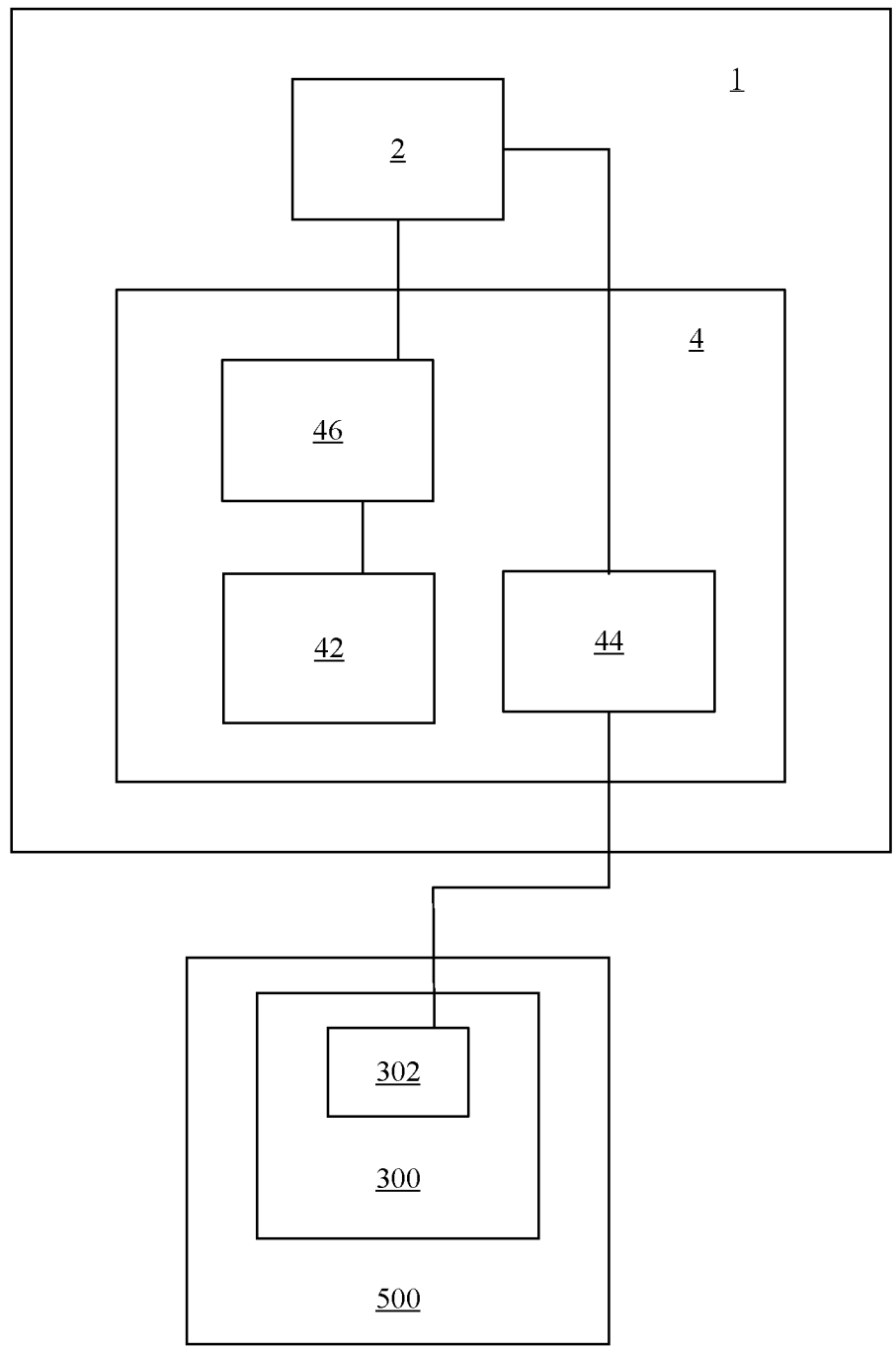
FIG. 2 is a block diagram of showing each unit in the purge controlling system in accordance with the present invention.

Next, please refer to FIG. 2. FIG. 2 is a detailed block diagram showing the purge controlling system disclosed in the present invention. In FIG. 2, the purge module 4 of the purge controlling system 1 is at least composed of an air curtain unit 42, a sensing unit 44, and a flow control unit 46. The flow control unit 46 couples to the air curtain unit 42 and the control module 2 respectively. The sensing unit 44 detects the displacement value of the door assembly 502 arranged on the load port 500 and transmits the sensing signal corresponding to the displacement value of the door assembly 502 to the control module 2. According to the sensing signal, the flow control unit 46 may regulate the gas flow or pressure of the purge gas entering into the air curtain unit 42. Therefore, the flow velocity of the gas curtain created by the air curtain unit 42 above the door assembly 502 of the load port 500 is controlled. Because there is a positive correlation between the flow velocity of the gas curtain and the gas flow of the purge gas entering the air curtain unit 42, the flow velocity of the gas curtain can be controlled by adjusting the gas flow of the purge gas entering the air curtain unit 42. The control method of the gas flow of the purge gas of the invention is that, for example, recipes of the gas flow of the purge gas are written into the control module 2, such as recipe A, recipe B, recipe C . . . , and recipe Z. Each of the recipes corresponds to a gas flow of the purge gas, which decides the flow velocity of the gas curtain. Moreover, each flow velocity of the gas curtain corresponds to a displacement value of the door assembly 502. Therefore, when the sensing unit 44 detects the change of the displacement value of the door assembly 502, the control module 2 may regulate the flow control unit 46 according to the displacement value of the door assembly 502 and the corresponding recipe, and the air curtain unit 42 will provide the desired flow velocity corresponding to the recipe. In other words, the control module 2 in the present embodiment controls the gas flow of the purge gas provided to the air curtain unit 42 in a multi-stage regulation to control the flow velocity of the gas curtain. For example, the flow velocity of the gas curtain corresponding to recipe A, recipe B, recipe C . . . , recipe Z may be from the smallest value to the largest value. When the displacement value of door assembly 502 is small (the displacement is small), the flow velocity of the gas curtain corresponding to recipe A is blown out by the air curtain unit 42; when the displacement value of the door assembly 502 increases (the displacement is large) to a certain range, the flow velocity of the gas curtain corresponding to recipe C is blown out by the air curtain unit 42. In this present invention, the calculation of the displacement value is based on position of the door assembly 502 when is not opened. That is, when the displacement value of the door assembly 502 gradually increases, the flow velocity of the gas curtain may be a fixed value when the displacement value of the door assembly 502 is in a certain change interval.

The calculation method of the displacement value of door assembly 502 is further described as below. In this present invention, the door assembly 502 is set as $P_0$ when the door assembly 502 is not opened (which means the wafer cassette is closed). Then, when the door assembly 502 is moved from the unopened $P_0$ to the first location point $P_1$, an opening on one side of the wafer cassette 300 will be exposed and the magnitude of the first displacement value of the door assembly 502 can be expressed as $P_1$-$P_0$. When the door assembly 502 is moved from the first location point $P_1$ to the second location point $P_2$, the magnitude of the second displacement value can be expressed as $P_2$-$P_0$.

More specific embodiment of this present invention is that when the door assembly 502 is opened to the first location point $P_1$, the air curtain unit 42 blows out the gas curtain with the first flow velocity corresponding to recipe A. When the door assembly 502 is opened to the second location point $P_2$, the air curtain unit 42 blows out the gas curtain with the second flow velocity corresponding to recipe B. When the door assembly 502 is opened to the third location point $P_3$, the air curtain unit 42 blows out the gas curtain with the third flow velocity corresponding to recipe C, and so on. When the second displacement value ($P_2$-$P_0$) of the door assembly 502 at the second location point $P_2$ is larger than the first displacement value ($P_1$-$P_0$) of the door assembly 502 at the first displacement location point $P_1$, the second flow velocity of the gas curtain is larger than the first flow velocity of the gas curtain. In another embodiment, when the second displacement value ($P_2$-$P_0$) of the door assembly 502 at the second location point $P_2$ is smaller than the first displacement value ($P_1$-$P_0$) of the door assembly 502 at the first location point $P_1$, the second flow velocity of the gas curtain is smaller than the first flow velocity of the gas curtain. Of course, the present invention is not limited to the above-mentioned multi-stage regulation method. In another embodiment, the flow velocity of the gas curtain can also be regulated continuously in a stepless method, that is, when the displacement value of the door assembly 502 increase gradually, the flow velocity of the gas curtain also increases gradually. Conversely, when the displacement value of the door assembly 502 is reduced gradually, the flow velocity of the gas curtain is reduced gradually. Accordingly, this invention can effectively save the gas flow of the purge gas and reduce the cost of the purge gas.

Figure 3:
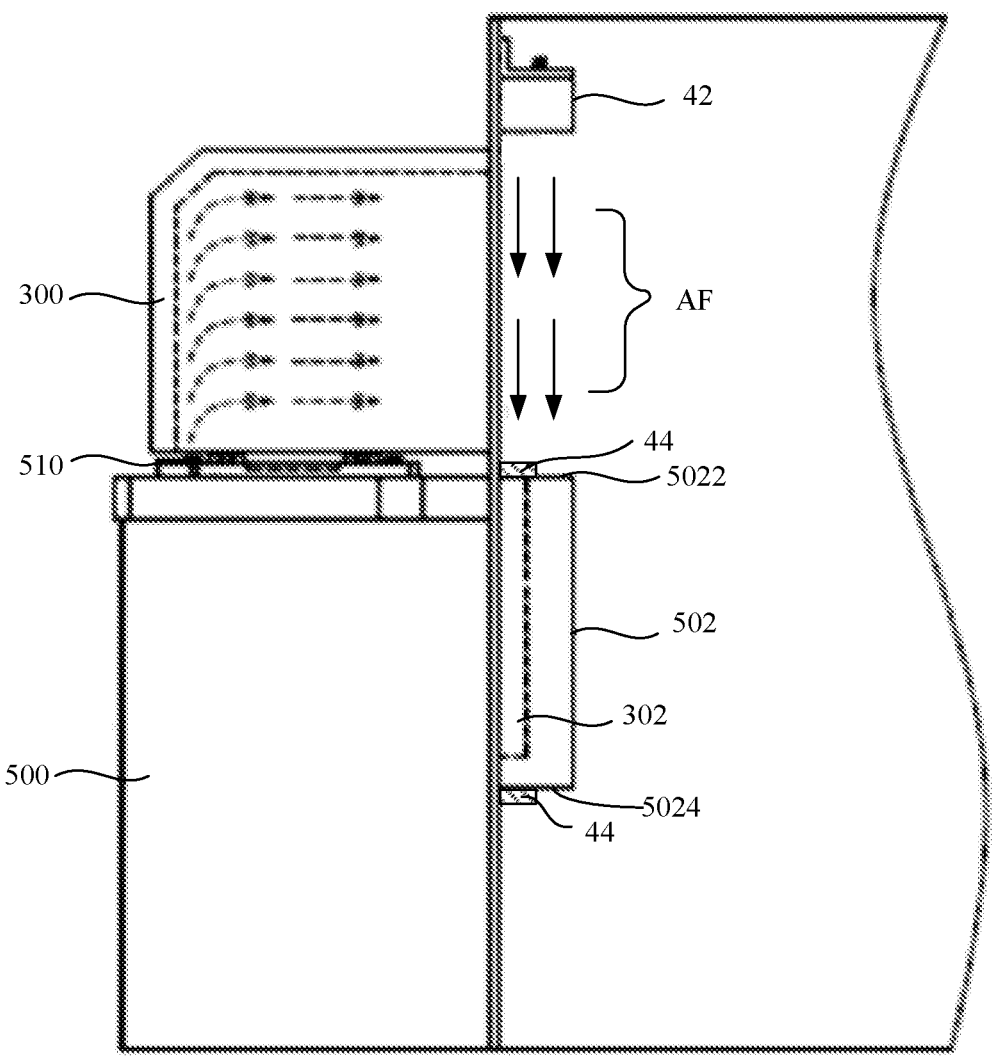
FIG. 3 is a side view of showing a load port with a purge controlling system in accordance with the present invention

Next, please refer to FIG. 3. FIG. 3 is a side view showing a load port with a purge controlling system. In FIG. 3, the load port 500 includes a carrier 510 to load the wafer cassette 300 thereon, and the load port 500 further includes a door assembly 502 and a door frame (not shown). The door assembly 502 is used to open the door body 302 of the wafer cassette 300 arranged on the carrier 510 and take the door body 302 away from the wafer cassette 300 and moves to a next displacement value, so that the interior of the wafer cassette 300 is communicated with the environment (can also be considered as outside of the wafer cassette 300). At this time, the wafer cassette 300 will expose an opening, through this opening according to the requirement, the external robot arm or user can place the semiconductor component(s) such as wafer (not shown) in the wafer cassette 300, or the semiconductor component(s) is taken out form the wafer cassette 300.

Please continue to refer to FIG. 3. The air curtain unit 42 is arranged above the door assembly 502 of the load port 500, and there is a distance between the air curtain unit 42 and the door assembly 502. When the air curtain unit 42 continuously and uniformly blows out the purge gas toward the door assembly 502, the gas curtain AF will be formed within this distance. The gas curtain AF is preferably a laminar flow, which can reduce the external contamination or particles that enter the wafer cassette 300. In addition, the flow velocity of the gas curtain created by the air curtain unit 42 will change with the different displacement value of the door assembly 502. In addition, a sensing unit 44 is further arranged on the peripheral (such as top 5022 and/or bottom 5024 of the door assembly 502) or door frame (not shown). The sensing unit 44 is used to detect the change of the displacement status (from closed to open) of the door assembly 502 or a predetermined displacement value. The sensing signal corresponding to this displacement value is transmitted to the control module 2 (as shown in FIG. 2), and then the control module 2 regulates the gas flow of the purge gas entering the air curtain unit 42.

Therefore, the control module 2 (as shown in FIG. 2) controls the gas flow of the purge gas provided by the gas supply device (not shown) flowing into the air curtain unit 42 according to the displacement values of the door assembly 502 detected by the sensing unit 44. The control module 2 can regulate the flow conduction of the purge gas blown out from the air curtain unit 42 to form a gas curtain in a laminar flow according to the gas flow of the purge gas that flows into the air curtain unit 42. In addition, the changes of the displacement value of the door assembly 502 is not necessarily need to be detected by the sensing unit 44. In another embodiment, the duration of the opening of the door assembly 502 can also be directly calculated to determine the changes of the displacement value. The method of obtaining the displacement value of the door assembly 502 is not limited in this invention.

Figure 4:
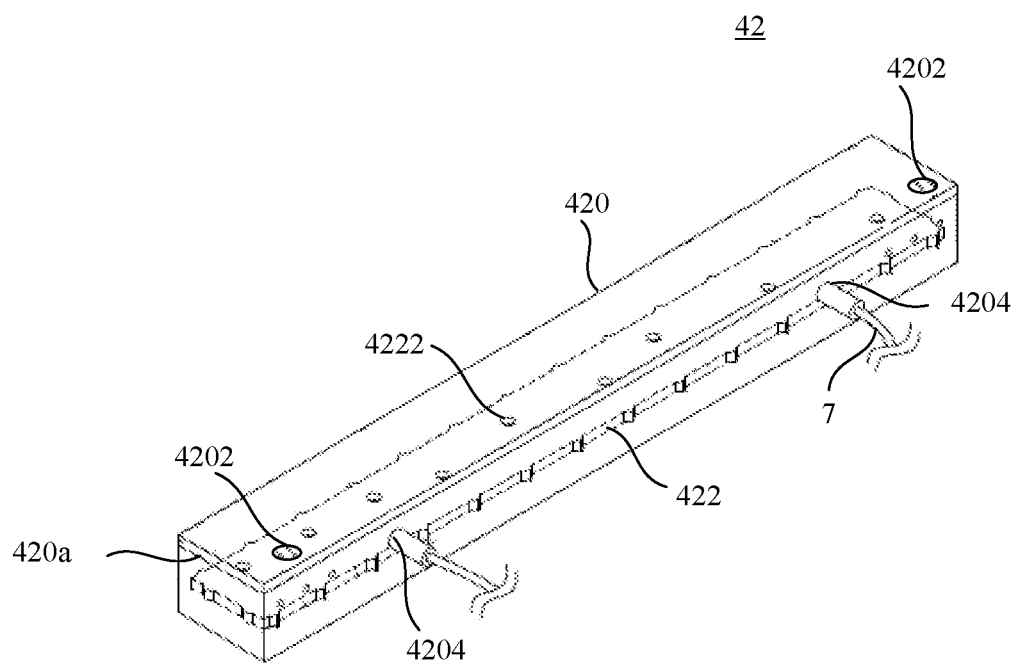
FIG. 4 is a schematic diagram of showing the air curtain unit of the purge module in accordance with the present invention.

Next, please refer to FIG. 4. FIG. 4 is a structural diagram showing the air curtain unit of the purge module. In FIG. 4, the air curtain unit 42 is composed of a main body 420, a cover plate 420a, at least a ventilation plate 422, and gas inlets 4202, 4204. The ventilation plate 422 includes a plurality of vents 4222 and is arranged in the inner space enclosed by the main body 420 and the cover plate 420a. The shape of the ventilation plate 422 can match with the main body 402 of the air curtain unit 42. The ventilation plate 422 forms an enclosed space in the air curtain unit 42, and the enclosed space can spatially communicate with the gas inlets 4202, 4204. The diameter of each of the vents 4222 may range from 0.001 μm to 10 mm, preferably 0.001 μm to 1 μm. In this embodiment, the number and distribution of the vents 4222 are not limited. For example, the vents 4222 may be distributed regularly or irregularly. The existence of the vents 4222 may induce the purge gas that passes through the ventilation plate 422 to form a uniform flow or laminar flow. In the preferred embodiment of this invention, the material of the ventilation plate 422 can be stainless steel, anti-static and corrosion-resistant fiber material or composite material, such as but not limited to glass fiber, epoxy glass fiber, Teflon (PTFE), ceramics, resin, or ultra-high molecular weight polyethylene (UPE, ultra-high molecular weight polyethylene). These materials can improve the original gas flow of the purge gas from 0-400 LPM (liter per minute) to 0-800 LPM, and the degree of resistance to gas pressure is also improved to avoid the ventilation plate 422 from bursting or having cracks due to high gas pressure of large gas flow.

In another preferred embodiment of the invention, the number of the ventilation plates 422 arranged in the main body 420 may be one or two or more, and the number of the ventilation plate 422 in the main body 420 may be changed to meet the user's requirement. For example, in one embodiment not shown in the drawings, two ventilation plates are spaced apart and form two enclosed spaces in the air curtain unit 42. In another embodiment not shown in the drawings, two ventilation plates are stacked to form an enclosed space in the air curtain unit 42. In addition, gas inlets 4202, 4204 are provided on the upper and/or longer sides of the rectangular main body 420. In another embodiment, the gas inlets 4202, 4204 may be provided on the shorter sides of the rectangular main body 420. In another embodiment, the gas inlet 4202, 4204 can also be respectively provided on the longer side and short side of the rectangular main body 420. The number of the gas inlets 4202, 4204 is not limited in this invention. The gas inlets 4202, 4204 provided on the main body 420 are connected to the gas supply device (not shown) through the pipeline 7. It should be noted that the gas supply device (not shown) is used to provide various purge gas, such as clean dry air (CDA), extreme clean dry air (X-CDA), or inert gas that enter the air curtain unit 42. In addition, in the embodiment of this invention, when the material of the ventilation plate 422 is stainless steel, the manufacturing method of the ventilation plate 422 with the plurality of vents 4222 can be formed by metal sintering. That is, the sintered metal powder can be used to form the stainless-steel ventilation plate 422 with inherent micro vents by sintering. In another embodiment, the plurality of vents 4222 of the ventilation plate 422 can be formed by laser drilling or mechanical drilling when the material of the ventilation plate 422 is stainless steel. In this invention, the plurality of vents 4222 can be arrange regularly or irregularly within the ventilation plate 422.

Next, an embodiment is given to illustrate the purging step of the purge controlling system for the load port of this invention. Please also refer to FIG. 2 to FIG. 4 when describing the purging steps of the purge controlling system for the load port. First, the sensing unit 44 detects the displacement value of the door assembly of the load port. In this step, when the status of the door assembly 502 of the load port 500 is from closed to open, the sensing unit 44 that arranged on the peripheral (such as top 5022 and/or bottom 5024) or the door frame (not shown) of the door assembly 502 detects the status of the door assembly 502 of the load port 500, and the moving distance of the door assembly 502 is defined as the first displacement value. At this time, the sensing unit 44 transmits a first signal corresponding to the first displacement value to the control module 2, and the control module 2 controls the gas supply device (not shown) according to the first signal to provide the corresponding first gas flow of purge gas to the purge module 4. The flow control unit 46 regulate the first gas flow of the purge gas entering the air curtain unit 42 corresponding to the first displacement value of the door assembly 502. Then, the air curtain unit 42 blows out the purge gas to form a gas curtain.

In the preferred embodiment of the invention, after the gas supply device (not shown) provides purge gas (not shown in the figure) to enter the air curtain unit 42 through the gas inlets 4202, 4204, the plurality of vents 4222 of the ventilation plate 422 in the air curtain unit 42 make the purge gas uniform and/or filter the particles in the purge gas to improve the cleanliness and uniformity of the purge gas. A gas curtain with a first flow velocity is created by the purge gas which uniformly blows from one side of the main body 420 opposite to the cover plate 420a and toward the door assembly 502 of the load port 500.

Next, when the moving distance of the door assembly 502 is a second displacement value, the sensing unit 44 transmits a second signal corresponding to the second displacement value to the control module 2. The control module 2 employs the flow control unit 46 to provide a purge gas with a second gas flow corresponding to the second signal, so the air curtain unit 24 blows out the purge gas to form a gas curtain with the second flow velocity toward the direction of the door assembly 502 of the load port 500. Although the gas flow of the purge gas controlled by the flow control unit 46 changes with the displacement value of the door assembly 502, the gas flow of the gas curtain is blown out continuously from the air curtain unit 42 toward the door assembly 502 of the load port 500. In this invention, regardless the amount of the displacement value of the door assembly 502, the gas flow of the gas curtain blown out from the air curtain unit 42 preferably is laminar flow, and the flow velocity of the gas curtain ranges from 0.1 m/s-2 m/s.

As the mention above, the displacement value of the door assembly 502 of the load port 500 is related to the flow velocity of the gas curtain from the air curtain unit 42. In this invention, the gas flow or/and pressure of the purge gas flows into the air curtain unit 42 can be controlled based on the displacement value of the door assembly 502 to form a laminar flow created by the air curtain unit 42 to avoid the generation of the turbulent flow near the door assembly 502 of the load port 500, and the problem of the contamination or particle carried into the wafer cassette 400 can be solved.

In addition, because the material of the ventilation plate 422 in the air curtain unit 42 is stainless steel, antistatic and corrosion-resistant fibers or composites, ceramic, resin or ultra-high molecular weight polyethylene, the gas flow of the purge gas entering the air curtain unit 42 can be increased to 0-800 LPM. Hence, the ventilation plate 422 has higher degree of resistance to gas pressure, and the lifetime of the air curtain unit 42 is more longer.

What is claimed is:

1. A purge controlling system connected with a load port for loading a wafer cassette, wherein a door assembly of the load port is used to open the door body of the wafer cassette, the purge controlling system comprising a purge module and a control module, wherein
    the purge module arranged in the load port comprising:
        an air curtain unit arranged above the door assembly of the load port to output a gas curtain towards the opening side of the wafer cassette, wherein the air curtain unit comprises: a main body, an upper end and/or one side of the main body including at least a gas inlet which communicated with a pipeline in the purge module, so that a purge gas from a gas supply device entering the main body through the pipeline and the gas inlet; and a ventilation plate arranged in the main body, the ventilation plate including a plurality of vents provided for discharging the purge gas out of the main body to form the gas curtain between the air curtain unit and the door assembly of the load port;
        a sensing unit arranged on the load port, wherein the sensing unit detects a displacement value of the door assembly of the load port and transmits a sensing signal corresponding to the displacement value of the door assembly to the control module; and
        a flow control unit coupling to the air curtain unit and the control module respectively to control a gas flow of a purge gas entering into the air curtain unit according to the sensing signal; and
    the control module electrically connected to the purge module, wherein the control module receives the sensing signal detected and transmitted from the sensing unit to regulate the flow control unit to control the air curtain unit to output a flow velocity of the gas curtain according to the displacement value of the door assembly; the flow velocity of the gas curtain increases when the displacement value of the door assembly increases; wherein when the door assembly moves to a first location point, the air curtain unit create the gas curtain with a first flow velocity, and when the door assembly moves to a second location point, the air curtain unit create the gas curtain with a second flow velocity, wherein when a second displacement value of the door assembly at the second location point is larger than a first displacement value of the door assembly at the first location point, the second flow velocity of the gas curtain is larger than the first flow velocity of the gas curtain, and when the second displacement value of the door assembly at the second location point is smaller than the first displacement value of the door assembly at the first location point, the second flow velocity is smaller than the first flow velocity.

2. The purge controlling system according to claim 1, wherein the material of the ventilation plate with the plurality of vents therein is stainless steel, antistatic and corrosion-resistant fiber or composite, ceramic, resin, or ultra-high molecular weight polyethylene.

3. The purge controlling system according to claim 2, wherein when the ventilation plate is stainless steel plate, the ventilation plate is formed by metal sintering.

4. The purge controlling system according to claim 2, wherein when the ventilation plate is stainless steel plate, the plurality of vents is formed by laser drilling or mechanical drilling.

5. The purge controlling system according to claim 1, wherein the diameters of the plurality of vents of the ventilation plate ranges from 0.001 μm to 10 mm.

6. The purge controlling system according to claim 1, wherein the flow velocity of the gas curtain, produced by the gas curtain unit, is in range from 0.1 m/s-2 m/s.

7. The purge controlling system according to claim 1, wherein the purge gas, produced by the gas supply device, is CDA (clean dry air), X-CDA (extreme clean dry air) or inert gas, and the gas flow of the purge gas is in range from 0-800LPM (liter per minute).

* * * * *